US012782410B2

(12) United States Patent
Izawa et al.

(10) Patent No.: US 12,782,410 B2
(45) Date of Patent: Nov. 3, 2026

(54) DETECTION DEVICE AND DETECTION METHOD

(71) Applicant: Sumitomo Electric Industries, Ltd., Osaka (JP)

(72) Inventors: Masato Izawa, Osaka (JP); Satoru Sakurazawa, Osaka (JP); Isao Kato, Osaka (JP); Shota Shimizu, Osaka (JP); Takashi Maehata, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 160 days.

(21) Appl. No.: 18/725,174

(22) PCT Filed: Oct. 11, 2022

(86) PCT No.: PCT/JP2022/037798

§ 371 (c)(1),
(2) Date: Jun. 28, 2024

(87) PCT Pub. No.: WO2023/139856

PCT Pub. Date: Jul. 27, 2023

(65) Prior Publication Data

US 2025/0060401 A1 Feb. 20, 2025

(30) Foreign Application Priority Data

Jan. 19, 2022 (JP) ................................. 2022-006068

(51) Int. Cl.
*G01R 31/08* (2020.01)
*G01R 31/11* (2006.01)
*G01R 31/58* (2020.01)

(52) U.S. Cl.
CPC ............ *G01R 31/088* (2013.01); *G01R 31/11* (2013.01); *G01R 31/58* (2020.01)

(58) Field of Classification Search
CPC ....... G01R 31/088; G01R 31/58; G01R 31/11
See application file for complete search history.

(56) References Cited

U.S. PATENT DOCUMENTS

| | | | | |
|---|---|---|---|---|
| 11,979,482 | B2 * | 5/2024 | Sakurazawa | H04L 7/02 |
| 12,282,052 | B2 * | 4/2025 | Yang | G01R 31/085 |
| 2020/0116777 | A1 * | 4/2020 | Cabanillas | G01R 31/08 |
| 2021/0351813 | A1 | 11/2021 | Omori et al. | |

FOREIGN PATENT DOCUMENTS

| | | | |
|---|---|---|---|
| JP | 2007-333468 | A | 12/2007 |
| JP | 2011-174727 | A | 9/2011 |
| WO | 2020/178968 | A1 | 9/2020 |

* cited by examiner

*Primary Examiner* — Reena Aurora
(74) *Attorney, Agent, or Firm* — XSENSUS LLP

(57) ABSTRACT

A detection device includes a signal output unit configured to output a 1-bit first digital signal representing a waveform of a predetermined pattern or a signal based on the first digital signal to a transmission line as a measurement signal, a signal reception unit configured to receive a response signal including a signal reflecting the measurement signal from the transmission line and convert the response signal into a 1-bit second digital signal, an operation unit configured to perform a logical operation of the second digital signal converted by the signal reception unit and a 1-bit third digital signal based on the predetermined pattern, and a detection unit configured to detect an abnormality of the transmission line, based on an operation result obtained by the operation unit.

20 Claims, 13 Drawing Sheets

CT

| THRESHOLD VALUE (FOR SECTION HAVING VALUE OF EVALUATION VALUE C) | ABNORMALITY POSITION |
|---|---|
| (Th4≦C<)Th5 | 20m |
| ⋮ | ⋮ |
| (Th2≦C<)Th3 | 10m |
| ⋮ | ⋮ |
| (C<)Th1 | NO ABNORMALITY |

DETECTION DEVICE AND DETECTION METHOD

CROSS-REFERENCE TO RELATED APPLICATIONS

The present application is based on PCT filing PCT/JP2022/037798, filed on Oct. 11, 2022, which claims the priority to the Japanese Patent Application No. 2022-006068, filed on Jan. 19, 2022, the entire contents of each are incorporated herein by reference.

TECHNICAL FIELD

The present disclosure relates to a detection device and a detection method.

BACKGROUND ART

Patent literature 1 discloses a device for detecting a disconnection point of a coated electric wire as follows. That is, the device for detecting a disconnection point of a coated electric wire includes a pulse generation circuit for applying a pulse to an electric wire to be inspected which is a coated electric wire to be inspected, a capacitive coupling probe capacitively coupled to the electric wire to be inspected, and a differential pulse detection circuit for detecting a differential pulse appearing in the capacitive coupling probe and, when the differential pulse is lost, causing a notification means to notify the loss.

CITATION LIST

Patent Literature

PTL 1: Japanese Unexamined Patent Application Publication No. 2011-174727

SUMMARY OF INVENTION

A detection device of the present disclosure includes a signal output unit configured to output a 1-bit first digital signal representing a waveform of a predetermined pattern or a signal based on the first digital signal to a transmission line as a measurement signal, a signal reception unit configured to receive a response signal including a signal reflecting the measurement signal from the transmission line and convert the response signal into a 1-bit second digital signal, an operation unit configured to perform a logical operation of the second digital signal converted by the signal reception unit and a 1-bit third digital signal based on the predetermined pattern, and a detection unit configured to detect an abnormality of the transmission line, based on an operation result obtained by the operation unit.

A detection method of the present disclosure is a detection method for a detection device, and includes outputting a 1-bit first digital signal representing a waveform of a predetermined pattern or a signal based on the first digital signal to a transmission line as a measurement signal, receiving a response signal including a signal reflecting the measurement signal from the transmission line and converting the response signal into a 1-bit second digital signal, performing a logical operation of the converted second digital signal and a 1-bit third digital signal based on the predetermined pattern, and detecting an abnormality of the transmission line, based on an operation result.

An aspect of the present disclosure can be implemented not only as a detection device including such characteristic processing units, but also as a program for causing a computer to execute steps of such characteristic processing, as a semiconductor integrated circuit that implements a part or all of the detection device, or as a system including the detection device.

DETAILED DESCRIPTION

Figure 1:
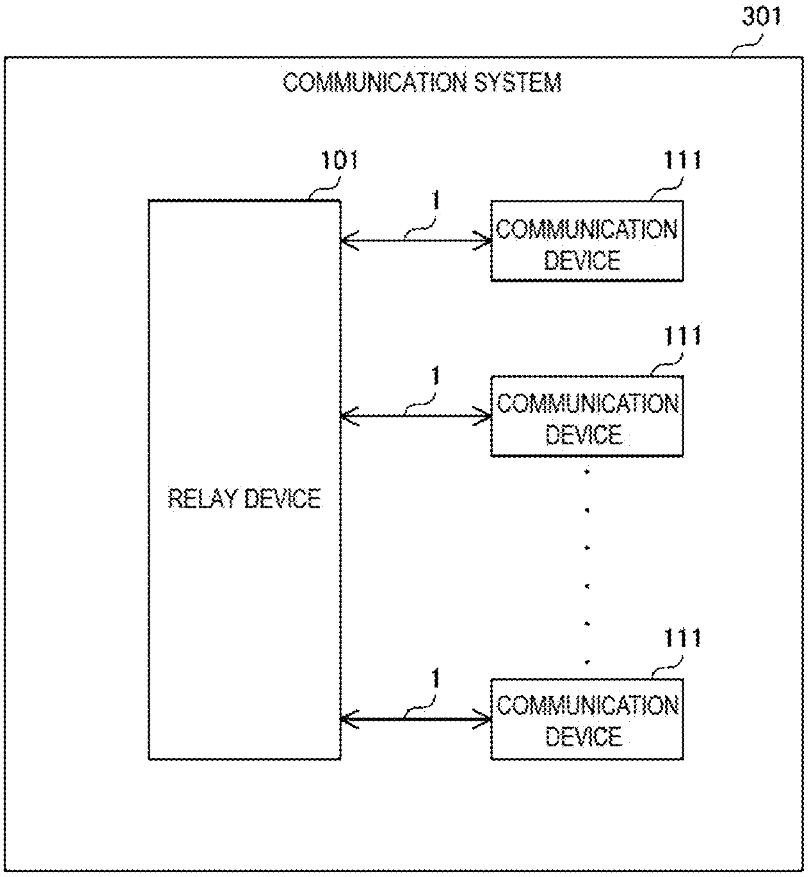
FIG. 1 is a diagram showing a configuration of a communication system according to an embodiment of the present disclosure.

Conventionally, a technique for detecting an abnormality of a transmission line has been proposed.

Problems to be Solved by Present Disclosure

A technique is desired that can detect an abnormality of the transmission line with simpler processing and configuration than in the related art.

The present disclosure has been made to solve the above-described problems, and an object of the present disclosure is to provide a detection device and a detection method capable of detecting an abnormality of the transmission line with a simple process and configuration.

Advantageous Effects of Present Disclosure

According to the present disclosure, it is possible to detect an abnormality of the transmission line with a simple process and configuration.

DESCRIPTION OF EMBODIMENTS OF PRESENT DISCLOSURE

First, the contents of embodiments of the present disclosure will be listed and explained.

(1) A detection device according to an embodiment of the present disclosure includes a signal output unit configured to output a 1-bit first digital signal representing a waveform of a predetermined pattern or a signal based on the first digital signal to a transmission line as a measurement signal, a signal reception unit configured to receive a response signal including a signal reflecting the measurement signal from the transmission line and convert the response signal into a 1-bit second digital signal, an operation unit configured to perform a logical operation of the second digital signal converted by the signal reception unit and a 1-bit third digital signal based on the predetermined pattern, and a detection unit configured to detect an abnormality of the transmission line, based on an operation result obtained by the operation unit.

In this way, an abnormality of the transmission line can be detected by a simple process and configuration in which the logical operation is performed between the second digital signal based on the response signal and the third digital signal as the reference signal and the operation result is used for the abnormality detection. Further, for example, by the configuration in which the 1-bit first digital signal or the signal based on the first digital signal is output to the transmission line, the interface between a digital circuit and an analog circuit can be simplified as compared with the configuration in which the analog signal is generated and output to the transmission line. Therefore, an abnormality of the transmission line can be detected by the simple process and configuration.

(2) In the above (1), the operation unit may be configured to calculate an exclusive OR of the second digital signal and the third digital signal.

With such a configuration, by observing the coincidence between the second digital signal and the third digital signal, an abnormality of the transmission line can be detected more accurately.

(3) In the above (1) or (2), the signal output unit may include a filtering circuit and is configured to output a signal obtained by subjecting the first digital signal to filtering processing by the filtering circuit to the transmission line as the measurement signal.

With such a configuration, since the measurement signal can be output to various transmission lines and the response signal can be received regardless of the specification of the transmission line, it is possible to increase the flexibility of the detection device for the type of the transmission line. In addition, since the noise component in the measurement signal can be reduced, an abnormality of the transmission line can be detected more accurately.

(4) In any one of the above (1) to (3), the first digital signal may be a signal obtained by performing delta-sigma modulation on the waveform of the predetermined pattern, and the signal reception unit may have a configuration that includes a delta-sigma modulator configured to convert the response signal into the second digital signal.

Thus, by using the first digital signal obtained by performing delta-sigma modulation, quantization noise can be reduced as compared with the case of using a digital signal obtained by another modulation method, and therefore, an abnormality of the transmission line can be detected more accurately.

(5) In any one of the above (1) to (4), the operation unit may include an adjustment unit configured to perform phase adjustment of the second digital signal and the third digital signal.

With such a configuration, since it is possible to absorb the phase shift of the second digital signal with respect to the third digital signal, it is possible to more accurately determine whether or not an abnormality of the transmission line occurs based on the result of the logical operation.

(6) In any one of the above (1) to (5), the detection device may further includes a storage unit configured to store correspondence information indicating a correspondence relationship between an integral of the operation result and an abnormality position on the transmission line. The detection unit may be configured to calculate the integral and, based on the calculated integral and the correspondence information, determine the abnormality position on the transmission line.

With such a configuration, when an abnormality occurs in the transmission line, it is possible to take measures such as repairing or replacing the abnormality position in the transmission line.

(7) In any one of the above (1) to (6), the operation unit may be configured to perform the logical operation by using the first digital signal as the third digital signal.

With such a configuration, it is possible to more accurately detect an abnormality of the transmission line by a simple method using the result of the logical operation using the first digital signal output as the measurement signal (8) A detection method according to an embodiment of the present disclosure is a detection method for a detection device, and includes outputting a 1-bit first digital signal representing a waveform of a predetermined pattern or a signal based on the first digital signal to a transmission line as a measurement signal, receiving a response signal including a signal reflecting the measurement signal from the transmission line and converting the response signal into a 1-bit second digital signal, performing a logical operation of the converted second digital signal and a 1-bit third digital signal based on the predetermined pattern, and detecting an abnormality of the transmission line, based on an operation result.

In this way, the abnormality of the transmission line can be detected by the simple process and configuration in which the logical operation is performed between the second digital signal based on the response signal and the third digital signal as the reference signal and the operation result is used for the abnormality detection. Further, for example, by the configuration in which the 1-bit first digital signal or the signal based on the first digital signal is output to the transmission line, the interface between the digital circuit and the analog circuit can be simplified as compared with the configuration in which the analog signal is generated and output to the transmission line. Therefore, the abnormality of the transmission line can be detected by the simple process and configuration.

Hereinafter, embodiments of the present disclosure will be described with reference to the drawings. In the drawings, the same or corresponding parts are denoted by the same reference numerals, and the description thereof will not be repeated. At least a part of the embodiments described below may be arbitrarily combined.

[Configuration and Basic Operation]

FIG. 1 is a diagram showing a configuration of a communication system according to an embodiment of the present disclosure. Referring to FIG. 1, a communication system 301 includes a relay device 101 and a plurality of communication devices 111.

Relay device 101 is connected to each communication device 111 in a one to-one manner via a transmission line 1. More specifically, transmission line 1 includes a cable portion and connector portions provided at a first end portion and a second end portion of the cable portion, respectively. The connector portion provided at the first end portion of the cable portion is connected to relay device 101. The connector portion provided at the second end portion of the cable portion is connected to communication device 111. Transmission line 1 is, for example, an Ethernet (registered trademark) cable. For example, transmission line 1 includes a termination resistor for impedance matching at the end portion of communication device 111 side.

Communication system 301 is mounted on a vehicle, for example. In this case, communication device 111 is, for example, a vehicle-mounted electronic control unit (ECU). Communication system 301 may be used for a home network or factory automation, for example.

Relay device 101 can communicate with communication device 111. Relay device 101 performs, for example, a relay processing of relaying information exchanged between a plurality of communication devices 111 connected to different transmission lines 1. Relay device 101 functions as a detection device and performs detection processing of detecting an abnormality of transmission line 1, periodically, for example.

[Relay Device]

Figure 2:
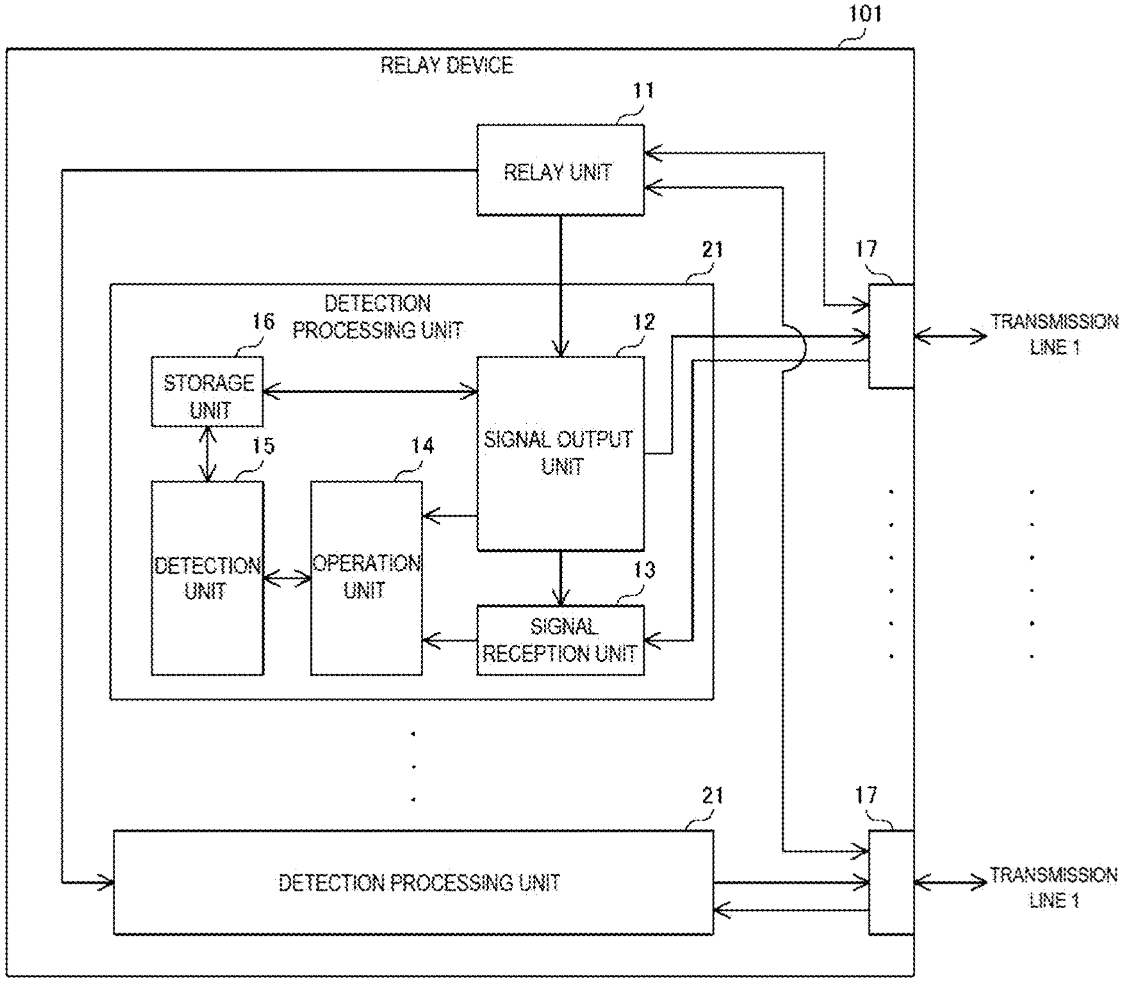
FIG. 2 is a diagram showing a configuration of a relay device according to an embodiment of the present disclosure.

FIG. 2 is a diagram showing a configuration of a relay device according to an embodiment of the present disclosure. Referring to FIG. 2, relay device 101 includes a relay unit 11, a plurality of detection processing units 21, and a plurality of communication ports 17. Detection processing unit 21 includes a signal output unit 12, a signal reception unit 13, an operation unit 14, a detection unit 15, and a storage unit 16. Relay unit 11, signal output unit 12, signal reception unit 13, operation unit 14, and detection unit 15 are implemented by a processor such as a central processing unit (CPU) and a digital signal processor (DSP), for example. Storage unit 16 is, for example, a non-volatile memory. Communication port 17 is a connector or a terminal. The connector portion of transmission line 1 is connected to each communication port 17.

<Relay Unit>

Relay unit 11 performs a relay processing. For example, relay unit 11 performs the relay processing of relaying a frame between communication devices 111. More specifically, relay unit 11 transmits a frame received from a certain communication device 111 via corresponding transmission line 1 and corresponding communication port 17 to another communication device 111 via corresponding communication port 17 and corresponding transmission line 1 according to destination information such as a destination Internet Protocol (IP) address, a MAC address, and a message ID of the frame.

<Detection Processing Unit>

For example, relay device 101 includes the same number of detection processing units 21 as the number of communication ports 17. More specifically, detection processing unit 21 is provided corresponding to communication port 17, and performs detection processing for detecting the abnormality of transmission line 1 connected to corresponding communication port 17. Hereinafter, detection processing by one detection processing unit 21 in relay device 101 will be described. Transmission line 1 to be detected by detection processing unit 21 is also referred to as a "target transmission line".

(Signal Output Unit)

Signal output unit 12 outputs a signal representing a waveform of a predetermined pattern based on a 1-bit digital signal Ds1 to the target transmission line as a measurement signal. For example, digital signal Ds1 is a signal obtained by performing pulse density modulation, for example, delta-sigma modulation, on a waveform of a predetermined pattern. Digital signal Ds1 is an example of the first digital signal.

For example, signal output unit 12 outputs a signal based on digital signal Ds1, that is, an analog signal output from a filtering circuit 123 to be described later to the target transmission line via corresponding communication port 17 and outputs digital signal Ds1 to operation unit 14 in a period in which the relay processing via the target transmission line is not performed by relay unit 11.

More specifically, relay unit 11 outputs period information indicating a period in which the relay processing via transmission line 1 is not performed to signal output unit 12 in detection processing unit 21 corresponding to transmission line 1.

Signal output unit 12 receives the period information from relay unit 11, determines a detection period T1 for performing the detection processing based on the received period information, and outputs detection information indicating determined detection period T1 to signal reception unit 13. Then, when the start time of determined detection period T1 arrives, signal output unit 12 outputs a signal based on digital signal Ds1 to the target transmission line via corresponding communication port 17 and outputs digital signal Ds1 to operation unit 14 until detection period T1 expires.

Figure 3:
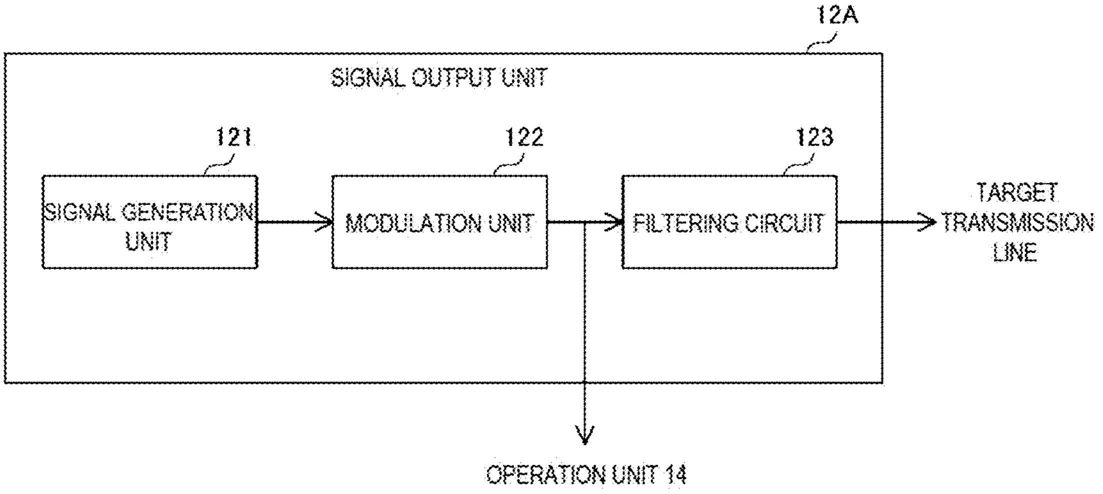
FIG. 3 is a diagram showing an example of a configuration of a signal output unit in a relay device according to an embodiment of the present disclosure.

FIG. 3 is a diagram showing an example of a configuration of a signal output unit in a relay device according to the embodiment of the present disclosure. FIG. 3 shows a configuration of a signal output unit 12A as an example of signal output unit 12.

Referring to FIG. 3, signal output unit 12A includes a signal generation unit 121, a modulation unit 122, and filtering circuit 123. For example, signal output unit 12A outputs a signal obtained by subjecting digital signal Ds1 obtained by performing delta-sigma modulation on a waveform of a sinusoidal wave to filtering processing by filtering circuit 123 to the target transmission line via communication port 17 as a measurement signal.

More specifically, signal generation unit 121 generates a sinusoidal wave Ws for a predetermined period and outputs sinusoidal wave Ws to modulation unit 122 in detection period T1. Signal generation unit 121 is, for example, a direct digital synthesizer (DDS).

Figure 4:
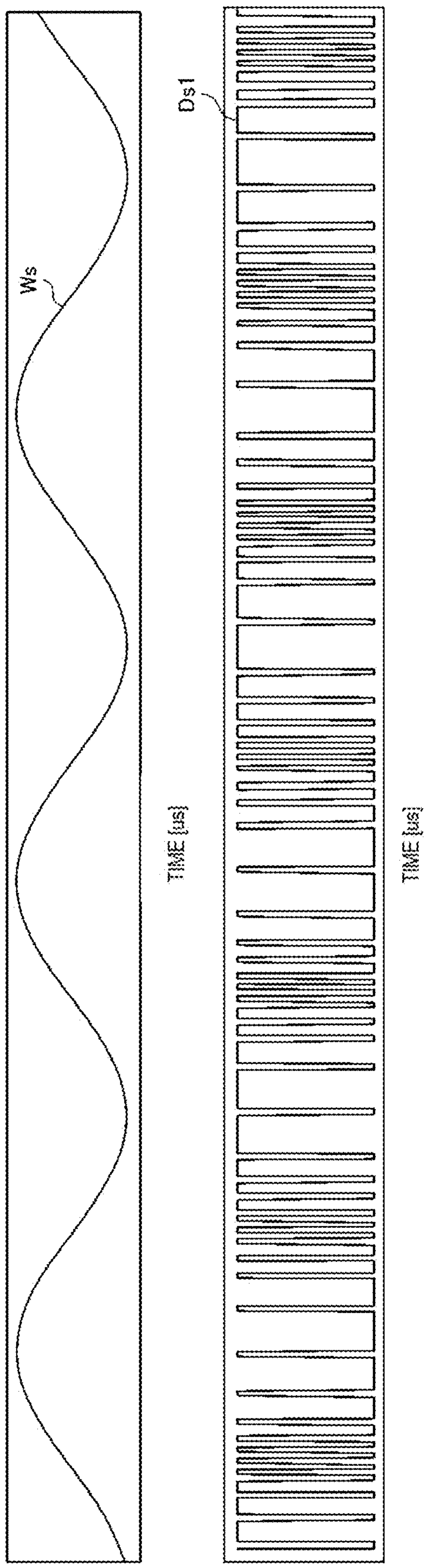
FIG. 4 is a diagram showing an example of a digital signal generated by a signal output unit in a relay device according to an embodiment of the present disclosure.

FIG. 4 is a diagram showing an example of a digital signal generated by a signal output unit in a relay device according to the embodiment of the present disclosure. In FIG. 4, the horizontal axis represents time, and the vertical axis represents a value corresponding to the voltage of the measurement signal output from signal output unit 12 to the target transmission line. FIG. 4 shows sinusoidal wave Ws generated by signal generation unit 121 and digital signal Ds1 generated by modulation unit 122.

Referring to FIG. 4, modulation unit 122 generates digital signal Ds1 by performing delta-sigma modulation on the waveform of sinusoidal wave Ws received from signal generation unit 121 at a modulation rate of, for example, 100 megasps (sample per second). Modulation unit 122 outputs generated digital signal Ds1 to the target transmission line via filtering circuit 123 and communication port 17. Modulation unit 122 outputs generated digital signal Ds1 to operation unit 14.

Filtering circuit 123 is a low-pass filter or a band-pass filter Filtering circuit 123 converts received digital signal Ds1 into an analog signal, and outputs the analog signal to the target transmission line as a measurement signal.

Figure 5:
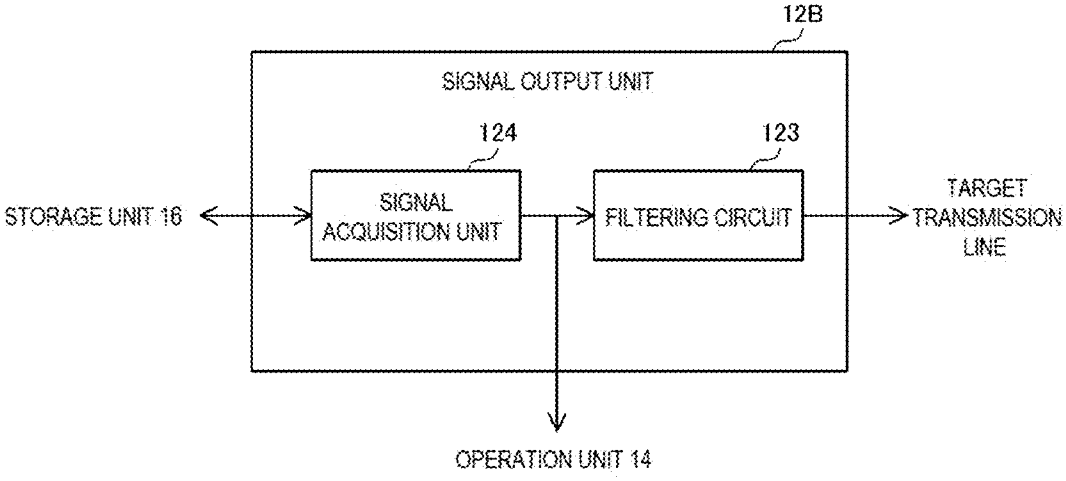
FIG. 5 is a diagram showing another example of a configuration of a signal output unit in a relay device according to an embodiment of the present disclosure.

FIG. 5 is a diagram showing another example of the configuration of the signal output unit in a relay device according to the embodiment of the present disclosure. FIG. 5 shows a configuration of a signal output unit 12B as an example of signal output unit 12.

Referring to FIG. 5, signal output unit 12B includes a signal acquisition unit 124 and filtering circuit 123. For example, signal output unit 12B outputs a signal obtained by subjecting digital signal Ds1 obtained by performing delta-sigma modulation a waveform of a sinusoidal wave to filtering processing by filtering circuit 123 to the target transmission line via communication port 17 as a measurement signal.

More specifically, storage unit 16 stores in advance digital signal Ds1 obtained by performing delta-sigma modulation on a waveform of a sinusoidal wave for a predetermined period.

Signal acquisition unit 124 acquires digital signal Ds1 from storage unit 16 in detection period T1, and outputs acquired digital signal Ds1 to the target transmission line via filtering circuit 123 and communication port 17. Signal acquisition unit 124 outputs acquired digital signal Ds1 to operation unit 14.

Signal output unit 12 may be configured to output digital signal Ds1 as a measurement signal to the target transmission line via communication port 17. More specifically, signal output unit 12A or 12B may have a configuration that does not include filtering circuit 123 when the target transmission line sufficiently functions as a low-pass filter due to a resistance component and a capacitance component of the target transmission line In this case, modulation unit 122 in signal output unit 12A outputs generated digital signal Ds1 to the target transmission line via communication port 17. Signal acquisition unit 124 in signal output unit 12B outputs digital signal Ds1 acquired from storage unit 16 to the target transmission line via communication port 17. Digital signal Ds1 output to the target transmission line by signal output unit 12 is smoothed by the resistance component and the capacitance component of the target transmission line.

(Signal Reception Unit)

Referring back to FIG. 2, signal reception unit 13 receives a response signal from the target transmission line. The response signal includes a reflected signal of the measurement signal output by signal output unit 12. For example, signal reception unit 13 receives the response signal including the measurement signal output by signal output unit 12 and the reflected signal that is a signal obtained by reflecting the measurement signal from the target transmission line via corresponding communication port 17.

More specifically, signal reception unit 13 receives the detection information from signal output unit 12, and starts a reception period Tm when the start time of detection period T1 indicated by the received detection information arrives. Signal reception unit 13 performs reception processing of the response signal from the target transmission line in reception period Tm. The length of reception period Tm is the same as the length of detection period T1, for example.

Signal reception unit 13 converts the received response signal into a 1-bit digital signal Ds2. Digital signal Ds2 is an example of a second digital signal. More specifically, signal reception unit 13 includes an AD converter that converts the response signal into digital signal Ds2. For example, the AD converter is a delta-sigma modulator. Signal reception unit 13 outputs converted digital signal Ds2 to operation unit 14.

Figure 6:
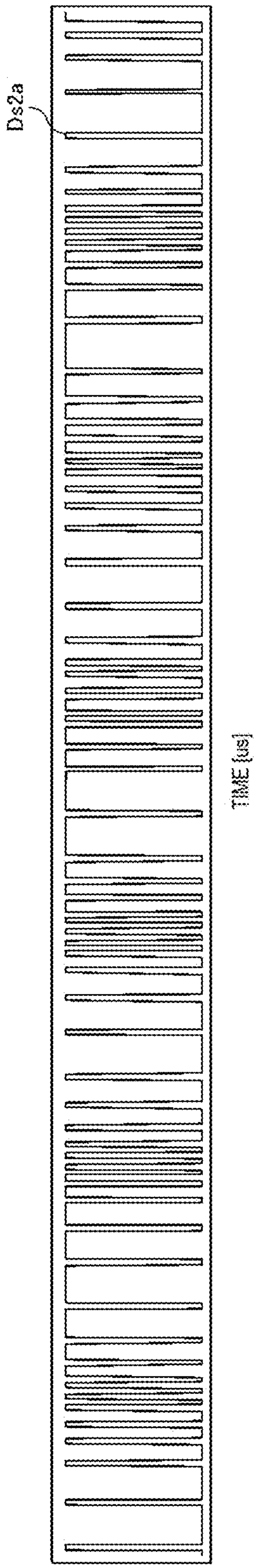
FIG. 6 is a diagram showing a simulation result of a digital signal converted by a signal reception unit in a relay device according to an embodiment of the present disclosure.

FIG. 6 is a diagram showing a simulation result of a digital signal converted by a signal reception unit in a relay device according to the embodiment of the present disclosure. In FIG. 6, the horizontal axis represents time, and the vertical axis represents a value corresponding to the voltage of the measurement signal output from signal output unit 12 to the target transmission line. FIG. 6 shows a simulation result of a digital signal Ds2*a* which is digital signal Ds2 converted by signal reception unit 13 when a measurement signal is output to a target transmission line which has an impedance of 50Ω, a length of 5 m, and is terminated in a matched manner by a termination resistor of 50Ω at the end portion at communication device 111.

Figure 7:
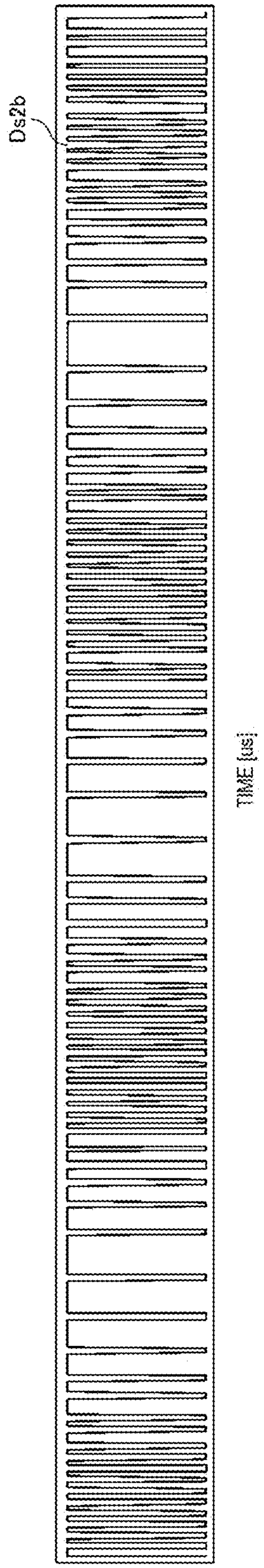
FIG. 7 is a diagram showing a simulation result of a digital signal converted by a signal reception unit in a relay device according to an embodiment of the present disclosure.

FIG. 7 is a diagram showing a simulation result of a digital signal converted by a signal reception unit in a relay device according to the embodiment of the present disclosure. In FIG. 7, the horizontal axis represents time, and the vertical axis represents a value corresponding to the voltage of the measurement signal output from signal output unit 12 to the target transmission line. FIG. 7 shows a simulation result of a digital signal Ds2*b* which is digital signal Ds2 converted by signal reception unit 13 when a measurement signal is output to a target transmission line which has an impedance of 50Ω, a length of 5 m, and a disconnection at 3 m from the end portion of relay device 101 side.

Referring to FIGS. 6 and 7, digital signal Ds2*b* converted by signal reception unit 13 when the target transmission line is disconnected is different from digital signal Ds2*a* converted by signal reception unit 13 when the target transmission line is not disconnected.

(Operation Unit)

Referring again to FIG. 2, operation unit 14 performs a logical operation of digital signal Ds2 converted by signal reception unit 13 and a 1-bit digital signal Ds3 based on the sinusoidal wave. Digital signal Ds3 is an example of a third digital signal. For example, operation unit 14 performs logical operation using digital signal Ds1 as digital signal Ds3.

For example, operation unit 14 calculates an exclusive OR X of digital signal Ds2 and digital signal Ds1. More specifically, operation unit 14 includes an XOR circuit. The XOR circuit calculates exclusive OR X of digital signal Ds1 received from signal output unit 12 and digital signal Ds2 received from signal reception unit 13. The XOR circuit outputs calculated exclusive OR X to detection unit 15. Exclusive OR X is an example of an operation result by operation unit 14.

Figure 8:
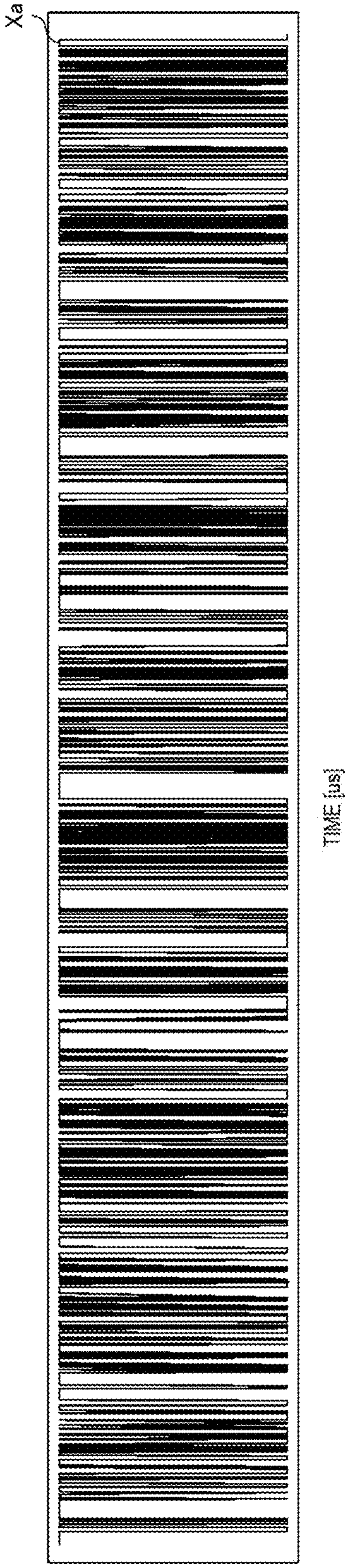
FIG. 8 is a diagram showing a simulation result of an exclusive OR calculated by an operation unit in a relay device according to an embodiment of the present disclosure.

FIG. 8 is a diagram showing a simulation result of an exclusive OR calculated by an operation unit in a relay device according to the embodiment of the present disclosure. In FIG. 8, the horizontal axis represents time, and the vertical axis represents a value corresponding to the voltage of the measurement signal output from signal output unit 12 to the target transmission line. FIG. 8 shows the simulation result of an exclusive OR Xa which is exclusive OR X of digital signal Ds1 and digital signal Ds2*a* shown in FIG. 6.

Figure 9:
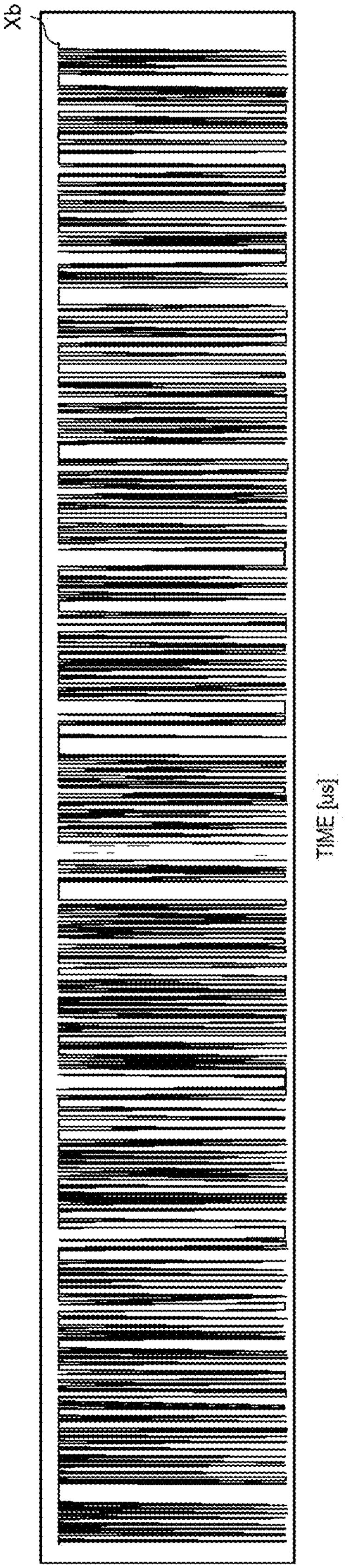
FIG. 9 is a diagram showing a simulation result of an exclusive OR calculated by an operation unit in a relay device according to an embodiment of the present disclosure.

FIG. 9 is a diagram showing a simulation result of an exclusive OR calculated by an operation unit in a relay device according to the embodiment of the present disclosure. In FIG. 9, the horizontal axis represents time, and the vertical axis represents a value corresponding to the voltage of the measurement signal output from signal output unit 12 to the target transmission line. FIG. 9 shows the simulation result of an exclusive OR Xb which is exclusive OR X of digital signal Ds1 and digital signal Ds2*b* shown in FIG. 7.

(Detection Unit)

Referring again to FIG. 2, detection unit 15 detects the abnormality of the target transmission line based on the operation result by operation unit 14. Detection unit 15 detects disconnection of the target transmission line, tapping of an unauthorized device on the target transmission line, and the like as the abnormality of the target transmission line.

More specifically, detection unit 15 integrates exclusive OR X received from operation unit 14 at a rate of, for example, 100 mega-times per second, thereby calculating an integral IV of exclusive OR X More specifically, detection unit 15 includes an accumulator that adds exclusive OR X received from operation unit 14, or a counter that counts the number of times exclusive OR X having the value "1" is received. Detection unit 15 determines the presence or absence of an abnormality of the target transmission line based on calculated integral IV.

Figures 10, 11:
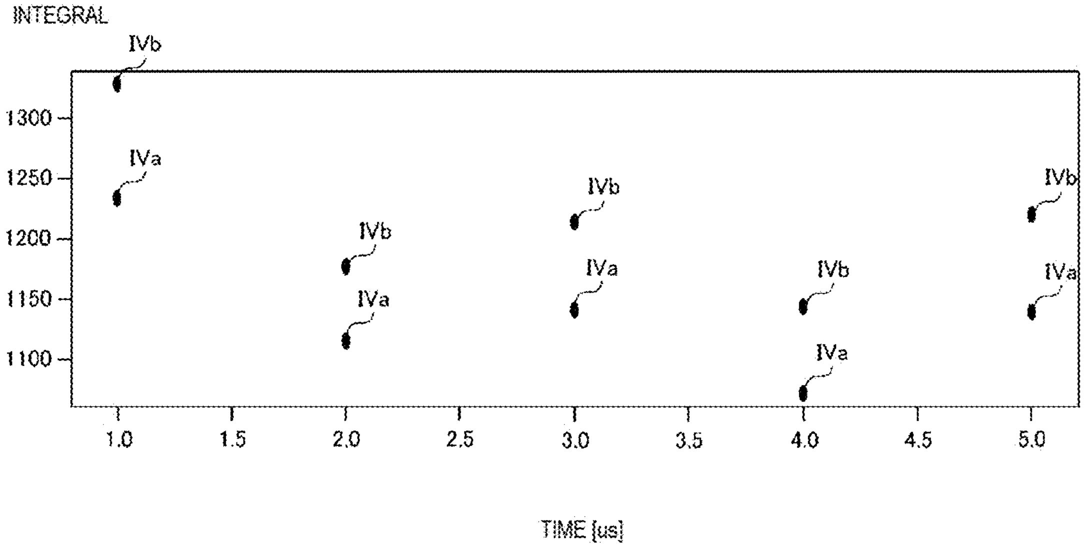
FIG. 10 is a diagram showing a simulation result of integral calculated by a detection unit in a relay device according to an embodiment of the present disclosure.
FIG. 11 is a diagram showing an example of a correspondence table stored in a storage unit in a relay device according to an embodiment of the present disclosure.

FIG. 10 is a diagram showing a simulation result of integral calculated by a detection unit in a relay device according to the embodiment of the present disclosure. In FIG. 10, the horizontal axis represents time, and the vertical axis represents integral. FIG. 10 shows the simulation results of integral IV of exclusive OR X during the preceding one microsecond, calculated every microsecond. FIG. 10 shows the simulation result of an integral IVa which is integral IV of exclusive OR Xa shown in FIG. 7 and the simulation result of an integral IVb which is integral IV of exclusive OR Xb shown in FIG. 8.

Referring to FIG. 10, integrals IVb calculated by detection unit 15 when the target transmission line is disconnected are larger than integrals IVa calculated by detection unit 15 when the target transmission line is not disconnected. Therefore, detection unit 15 can determine whether or not an abnormality occurs in the target transmission line based on the magnitude of calculated integral IV.

For example, storage unit 16 stores a reference value SV which is integral IV calculated by detection unit 15 when the detection processing is performed in a state where no abnormality occurs in the target transmission line.

Detection unit 15 calculates integral IV of exclusive OR X received from operation unit 14 in a period of a predetermined length such as 1 microsecond, and subtracts reference value SV in storage unit 16 from integral IV, thereby calculating a difference D between integral IV and reference value SV as an evaluation value C which is an integral used for the abnormality determination. Detection unit 15 calculates one or the plurality of differences D as evaluation value C in one detection period T1. Detection unit 15 determines whether or not an abnormality occurs in the target transmission line based on calculated evaluation value C. Note that detection unit 15 may be configured to calculate an average value of the plurality of differences D in detection period T1 as evaluation value C.

FIG. 11 is a diagram showing an example of a correspondence table stored in a storage unit in a relay device according to the embodiment of the present disclosure.

Referring to FIG. 11, storage unit 16 stores, as a correspondence table CT, threshold values Th1 to Th5 and a correspondence relationship (correspondence information) between abnormality positions of the target transmission line and sections having the value of evaluation value C determined based on threshold values Th1 to Th5. Correspondence table CT is an example of correspondence information.

For example, detection unit 15 determines the abnormality position on the target transmission line based on the calculated one or more evaluation values C and correspondence table CT in storage unit 16.

More specifically, when evaluation value C is a value in the section less than threshold value Th1, detection unit 15 determines that the abnormality does not occur in the target transmission line. On the other hand, for example, when evaluation value C is a value in the section that is equal to or greater than threshold value Th2 and less than threshold value Th3, detection unit 15 determines that abnormality occurs in the target transmission line at a position separated by 10 m from the end portion of relay device 101 side. For example, when evaluation value C is a value in the section that is equal to or greater than threshold value Th4 and less than threshold value Th5, detection unit 15 determines that the abnormality occurs in the target transmission line at a position separated by 20 m from the end portion of relay device 101 side. When detection unit 15 calculates the plurality of evaluation values C corresponding to a plurality of different sections in correspondence table CT in one detection period T1, detection unit 15 selects a section in which evaluation value C appears most frequently among the plurality of sections, thereby determining whether or not an abnormality occurs in the target transmission line and the abnormality position on the target transmission line.

Threshold value Th1 is determined in advance based on evaluation value C calculated by detection unit 15 when the detection processing is performed in a state where the abnormality does not occur in the target transmission line. Threshold values Th2 and Th3 are determined in advance based on evaluation value C calculated by detection unit 15 when the detection processing is performed in a state where the abnormality occurs in the target transmission line at a position separated by 10 m from the end portion of relay device 101 side. Threshold values Th4 and Th5 are determined in advance based on evaluation value C calculated by detection unit 15 when the detection processing is performed in a state where the abnormality occurs in the target transmission line at a position separated by 20 m from the end portion of relay device 101 side.

For example, when detection unit 15 determines that the abnormality of the target transmission line occurs, detection unit 15 notifies the user of the determination result via the communication unit (not shown) and communication device 111.

The correspondence information is not limited to the correspondence table described above. The correspondence information may be a representative value set for each abnormality position on the target transmission line, and detection unit 15 may determine the abnormality position corresponding to the representative value closest to evaluation value C.

Modification

Figure 12:
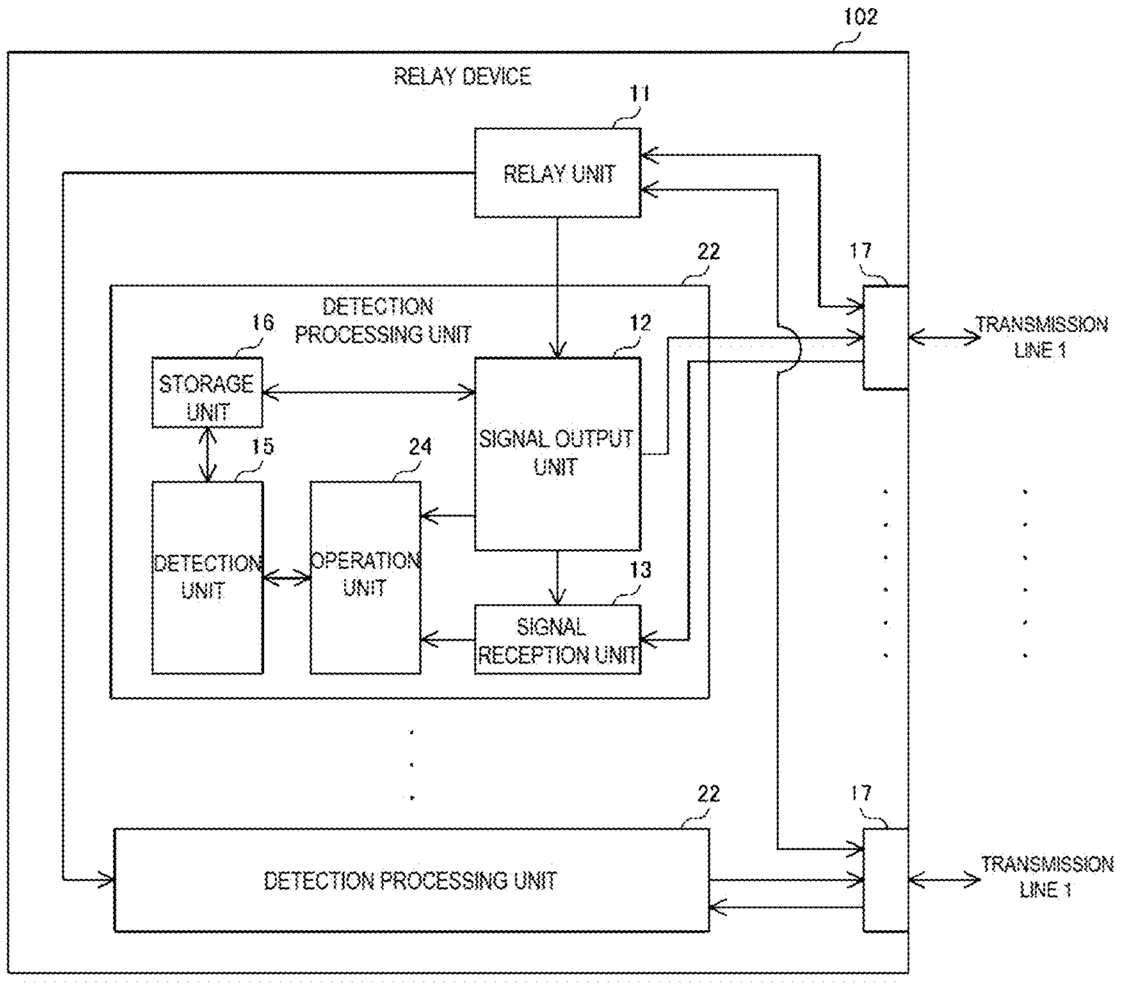
FIG. 12 is a diagram showing a configuration of a relay device according to a modification of an embodiment of the present disclosure.

FIG. 12 is a diagram showing a configuration of a relay device according to a modification of the embodiment of the present disclosure. Referring to FIG. 12, a relay device 102 includes a detection processing unit 22 instead of detection processing unit 21, compared with relay device 101. Detection processing unit 22 includes an operation unit 24 instead of operation unit 14, as compared with detection processing unit 21.

Figure 13:
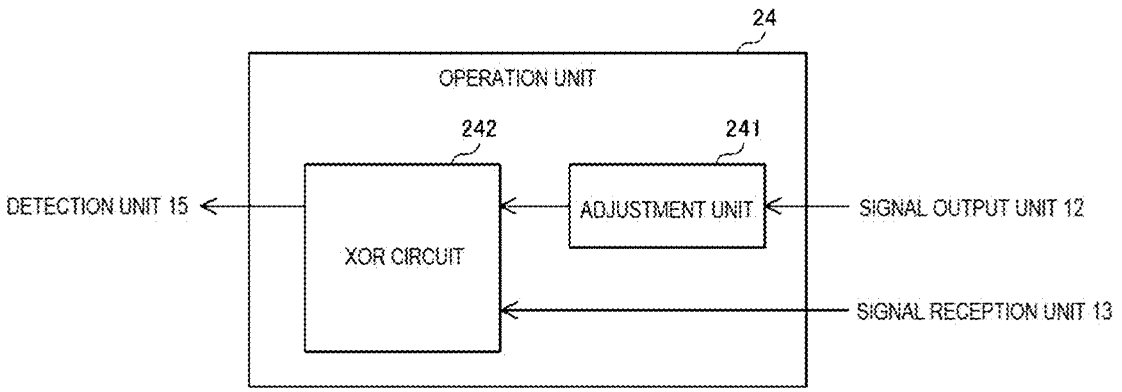
FIG. 13 is a diagram showing a configuration of an operation unit in a relay device according to a modification of an embodiment of the present disclosure.

FIG. 13 is a diagram showing a configuration of an operation unit in a relay device according to a modification of the embodiment of the present disclosure. Referring to FIG. 13, operation unit 24 includes an adjustment unit 241 and an XOR circuit 242.

Adjustment unit 241 performs phase adjustment of digital signal Ds2 and digital signal Ds1. For example, adjustment unit 241 receives digital signal Ds1 from signal output unit 12, performs delay processing on received digital signal Ds1, and then outputs digital signal Ds1 to XOR circuit 242. More specifically, adjustment unit 241 holds digital signal Ds1 received from signal output unit 12 for a predetermined delay time DT and then outputs digital signal Ds1 to XOR circuit 242 as the delay processing. Adjustment unit 241 is, for example, a shift register.

XOR circuit 242 calculates exclusive OR X of digital signal Ds1 received from adjustment unit 241 and digital signal Ds2 received from signal reception unit 13, and outputs calculated exclusive OR X to detection unit 15.

Figure 14:
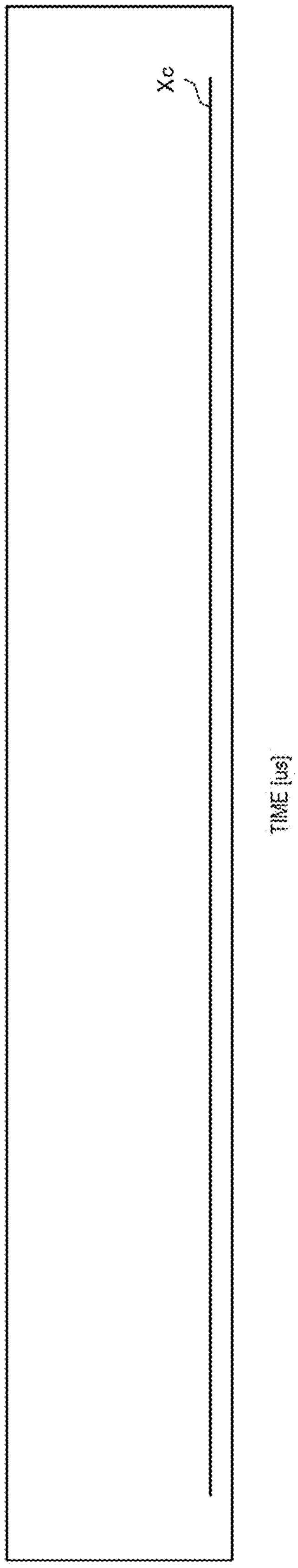
FIG. 14 is a diagram showing a simulation result of an exclusive OR calculated by an operation unit in a relay device according to a modification of an embodiment of the present disclosure.

FIG. 14 is a diagram showing a simulation result of an exclusive OR calculated by an operation unit in a relay device according to a modification of the embodiment of the present disclosure. In FIG. 14, the horizontal axis represents time, and the vertical axis represents a value corresponding to the voltage of the measurement signal output from signal output unit 12 to the target transmission line. FIG. 14 shows a simulation result of an exclusive OR Xc which is exclusive OR X between digital signal Ds1 delayed by adjustment unit 241 and digital signal Ds2 shown in FIG. 6.

Referring to FIG. 14, delay time DT in the delay processing of adjustment unit 241 is set in advance so that exclusive OR Xc calculated by XOR circuit 242 becomes zero when the target transmission line is not disconnected.

Figure 15:
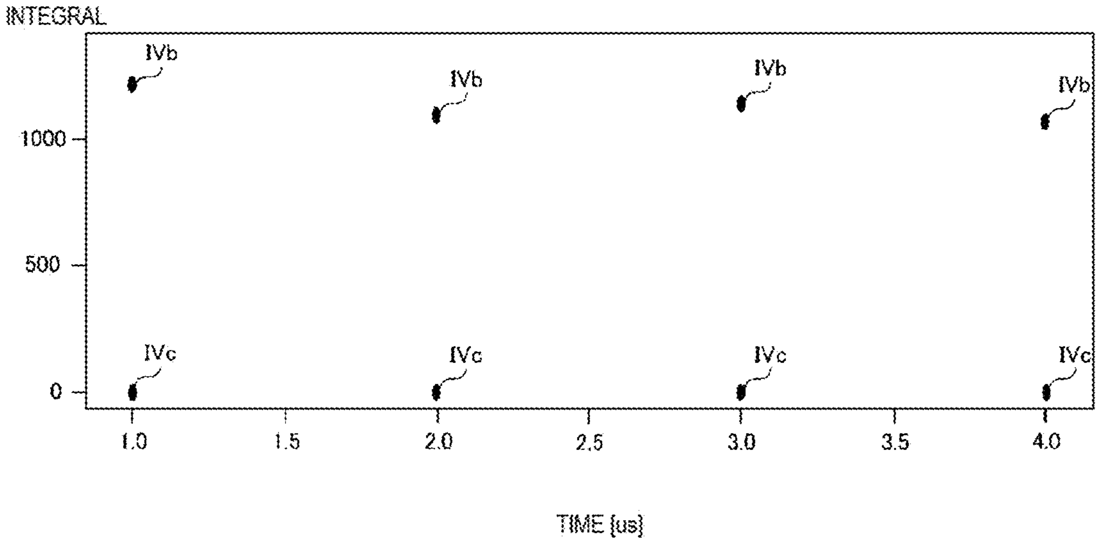
FIG. 15 is a diagram showing a simulation result of integral calculated by a detection unit in a relay device according to a modification of an embodiment of the present disclosure.

FIG. 15 is a diagram showing a simulation result of integral calculated by a detection unit in a relay device according to a modification of the embodiment of the present disclosure. The view of FIG. 15 is the same as FIG. 10. FIG. 15 shows the simulation result of an integral IVc which is integral IV of exclusive OR Xc shown in FIG. 14, instead of the simulation result of integral IVa.

Referring to FIGS. 10 and 15, the difference between integral IVb and integral IVc is larger than the difference between integral IVb and integral IVa. Therefore, in relay device 102 according to the modification, adjustment unit 241 in operation unit 24 performs the delay processing on digital signal Ds1, and thus detection unit 15 can more accurately determine whether or not the abnormality of the target transmission line occurs based on integral IV.

[Flow of Operation]

Each device in the communication system according to the embodiment of the present disclosure includes a computer including a memory, and an arithmetic processing unit such as a CPU in the computer reads a program including a part or all of each step of the following flowcharts and sequences from the memory and executes the program. The programs of the plurality of devices can be installed from the outside. The programs of the plurality of devices are distributed in a state of being stored in recording media or via a telecommunication line.

Figure 16:
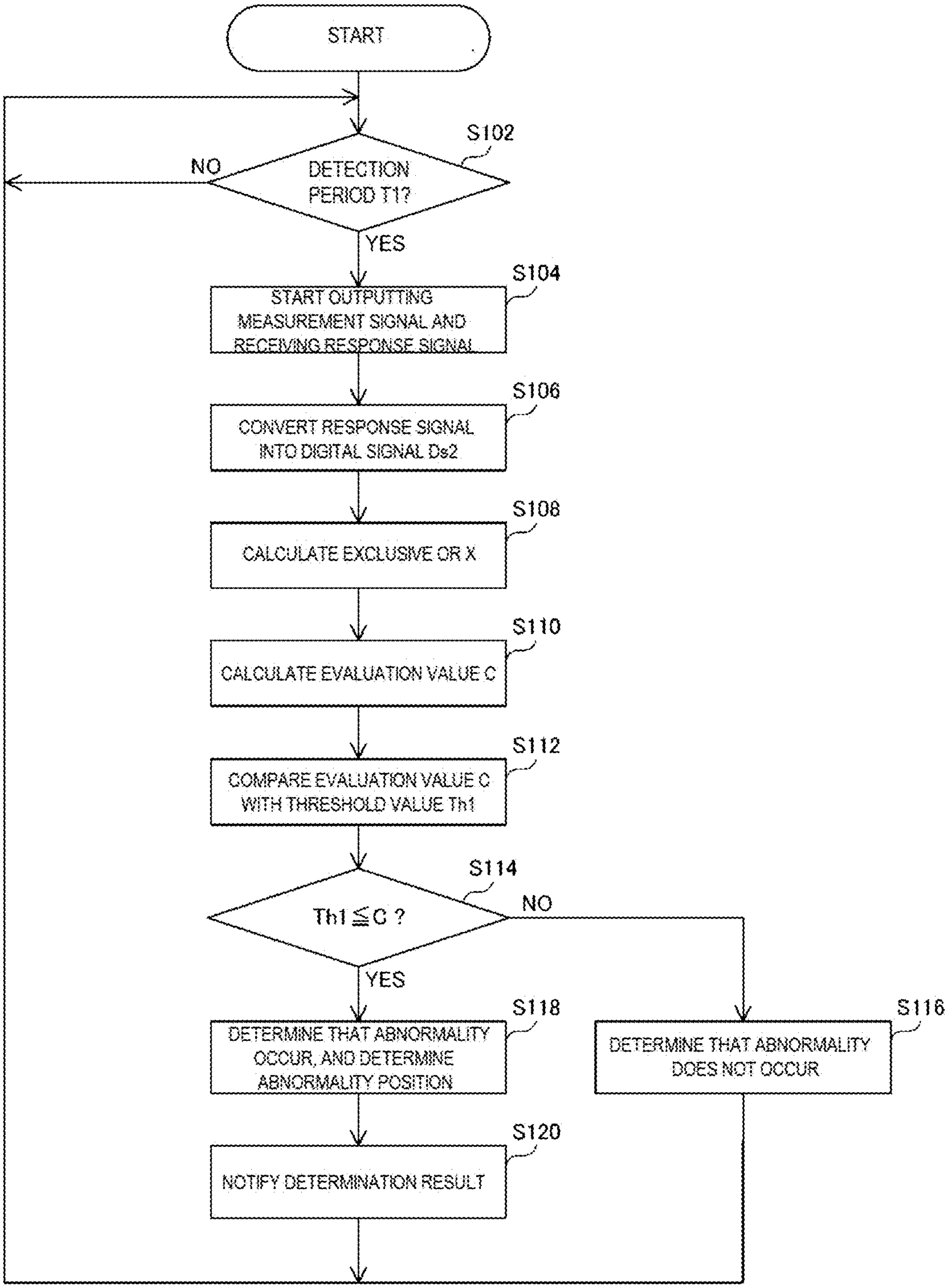
FIG. 16 is a flowchart showing an example of an operation procedure when a relay device according to an embodiment of the present disclosure performs detection processing.

FIG. 16 is a flowchart showing an example of an operation procedure when a relay device according to the embodiment of the present disclosure performs detection processing.

Referring to FIG. 16, first, relay device 101 waits for detection period T1 to arrive (NO in step S102), and when detection period T1 arrives (YES in step S102), relay device 101 starts outputting a measurement signal and receiving a response signal. More specifically, in detection period T1, relay device 101 outputs an analog signal obtained by performing analog conversion on 1-bit digital signal Ds1 to the target transmission line as a measurement signal, and receives a response signal from the target transmission line in response to the measurement signal (step S104).

Next, relay device 101 converts the received response signal into 1-bit digital signal Ds2 (step S106).

Next, relay device 101 performs a logical operation of converted digital signal Ds2 and digital signal Ds1. More specifically, relay device 101 calculates exclusive OR X of digital signal Ds2 and digital signal Ds1 (step S108).

Next, relay device 101 calculates evaluation value C by subtracting reference value SV in storage unit 16 from integral IV of exclusive OR X calculated in the period of the predetermined length (step S110).

Next, relay device 101 compares evaluation value C with threshold value Th1 in correspondence table CT (step S112).

Next, when evaluation value C is less than threshold value Th1 (NO in step S114), relay device 101 determines that the abnormality does not occur in the target transmission line (step S116), and waits for the arrival of new detection period T1 (NO in step S102).

On the other hand, when evaluation value C is equal to or greater than threshold value Th1 (YES in step S114), relay device 101 determines that an abnormality occurs in the target transmission line. For example, relay device 101 determines the abnormality position on the target transmission line based on evaluation value C and a result of comparison with a plurality of threshold values in correspondence table CT (step S118).

Next, relay device 101 notifies the user of the determination result via the communication unit (not shown) and communication device 111 (step S120), and waits for the arrival of new detection period T1 (NO in step S102).

In communication system 301 according to the embodiment of the present disclosure, relay device 101 is connected to communication device 111 in a one to-one manner via transmission line 1, but the present disclosure is not limited to this configuration. Relay device 101 may be configured to be connected to the plurality of communication devices 111 in a one to-many manner via bus-type transmission line 1.

In communication system 301 according to the embodiment of the present disclosure, relay device 101 performs the detection processing, but the present disclosure is not limited to this configuration. A configuration may be adopted in which an device different from relay device 101 in communication system 301 performs the detection processing. Specifically, for example, communication device 111 may be configured to function as a detection device and perform detection processing.

In relay device 101 according to the embodiment of the present disclosure, signal output unit 12 outputs a signal based on digital signal Ds1 to the target transmission line as a measurement signal. Digital signal Ds1 is obtained by performing delta-sigma modulation on a sinusoidal waveform. The present disclosure is not limited thereto. Digital signal Ds1 may be obtained by performing delta-sigma modulation on a waveform having a pattern other than sinusoidal waves, such as a rectangular wave. However, in signal output unit 12A described above, in the configuration in which signal generation unit 121 generates sinusoidal wave Ws, the configuration of signal generation unit 121 can be simplified as compared with the configuration in which a waveform other than sinusoidal wave Ws is generated. In signal output unit 12B described above, in the configuration in which signal acquisition unit 124 acquires digital signal Ds1 obtained by performing delta-sigma modulation on the waveform of the sinusoidal wave, the amount of data of digital signal Ds1 to be stored in storage unit 16 in advance can be reduced as compared with the configuration in which digital signal Ds1 obtained by performing delta-sigma modulation on the waveform of the pattern other than the sinusoidal wave is acquired.

In relay device 101 according to the embodiment of the present disclosure, signal output unit 12 is configured to output the measurement signal to the target transmission line in the period in which the relay processing by relay unit 11 is not performed, but the present disclosure is not limited thereto. Signal output unit 12 may be configured to output the measurement signal to the target transmission line in a period in which the relay processing is performed by relay unit 11. In this case, for example, relay device 101 frequency-division multiplexes the communication signal and the measurement signal More specifically, signal output unit 12 generates a measurement signal of a frequency band different from the frequency band of the communication signal transmitted and received by relay unit 11, and outputs the measurement signal to the target transmission line.

In relay device 101 according to the embodiment of the present disclosure, signal output unit 12 is configured to output digital signal Ds1 obtained by performing delta-sigma modulation on the waveform of the sinusoidal wave or a signal based on digital signal Ds1 as the measurement signal to the target transmission line, but the present disclosure is not limited thereto. Signal output unit 12 may be configured to output digital signal Ds1 obtained by performing pulse width modulation (PWM) on a waveform of a sinusoidal wave or a signal based on digital signal Ds1 to the target transmission line as the measurement signal.

In relay device 101 according to the embodiment of the present disclosure, signal reception unit 13 includes the delta-sigma modulator that converts the response signal into digital signal Ds2, but the configuration is not limited thereto. Signal reception unit 13 may be configured to include a comparator and a DA (Digital to Analog) converter instead of the delta-sigma modulator.

In relay device 101 according to the embodiment of the present disclosure, operation unit 14 includes the XOR circuit that calculates exclusive OR X of digital signal Ds2 and digital signal Ds1, but the present disclosure is not limited to this. Operation unit 14 may be configured to include a logical operation element that calculates a value of another logical operation such as a logical conjunction and a logical sum instead of the XOR circuit. Operation unit 14 may be configured to include an analog switch instead of a logical operation element such as an XOR circuit. The analog switch is turned on to pass digital signal Ds2 to detection unit 15 when digital signal Ds1 is high, and is turned off to cut off digital signal Ds2 when digital signal Ds1 is low. In this case, detection unit 15 includes, for example, a capacitor.

In relay device 101 according to the embodiment of the present disclosure, operation unit 14 is configured to perform logical operation using digital signal Ds1 as digital signal Ds3, but the present disclosure is not limited to this. Operation unit 14 may be configured to perform logical operation using digital signal Ds3 different from digital signal Ds1. For example, signal output unit 12 outputs digital signal Ds3 generated by processing digital signal Ds1 to operation unit 14. Operation unit 14 performs a logical operation using digital signal Ds3 received from signal output unit 12.

In relay device 101 according to the embodiment of the present disclosure, detection unit 15 determines the abnormality position on the target transmission line based on evaluation value C and correspondence table CT in storage unit 16, but the present disclosure is not limited thereto. Detection unit 15 may be configured to determine whether or not the abnormality of the target transmission line occurs, but not to determine the abnormality position.

In relay device 101 according to the embodiment of the present disclosure, signal output unit 12B is configured to acquire digital signal Ds1 from storage unit 16 and output acquired digital signal Ds1 to operation unit 14, but the configuration is not limited thereto. For example, when signal output unit 12B outputs digital signal Ds1 to the target transmission line via filtering circuit 123, signal output unit 12B notifies operation unit 14 that digital signal Ds1 has been output. Operation unit 14 receives the notification from signal output unit 12B, acquires digital signal Ds1 from storage unit 16, and calculates exclusive OR X of acquired digital signal Ds1 and digital signal Ds2.

Similarly, in relay device 102 according to the modification of the embodiment of the present disclosure, operation unit 24 may be configured to receive a notification from signal output unit 12B, acquire digital signal Ds1 from storage unit 16, and calculate exclusive OR X of acquired digital signal Ds1 and digital signal Ds2. In this case, adjustment unit 241 in operation unit 24 may adjust the timing of acquiring digital signal Ds1 from storage unit 16 instead of performing the delay processing on digital signal Ds1 received from signal output unit 12.

In relay device 101 according to the embodiment of the present disclosure, signal reception unit 13 is configured to receive the response signal including the measurement signal output by signal output unit 12 and the reflected signal which is a signal obtained by reflecting the measurement signal from the target transmission line via corresponding communication port 17, but the present disclosure is not limited thereto. Signal reception unit 13 may be configured to receive a response signal that does not include a measurement signal. That is, signal reception unit 13 may be configured to receive the reflected signal as the response signal. More specifically, signal output unit 12 outputs the measurement signal to the target transmission line via the directional coupler and communication port 17 Signal reception unit 13 receives a response signal not including the measurement signal from the target transmission line via communication port 17 and the directional coupler.

Further, relay device 101 according to the embodiment of the present disclosure is configured to include the same number of detection processing units 21 as the number of communication ports 17, but the present disclosure is not limited thereto. Relay device 101 may be configured to include a smaller number of detection processing units 21 than the number of communication ports 17. In this case, one or more detection processing units 21 in relay device 101 detect the abnormality of the plurality of transmission lines 1 connected to the plurality of communication ports 17, respectively. Similarly, relay device 102 may be configured to include detection processing units 22 the number of which is smaller than the number of communication ports 17.

Further, transmission line 1 according to the embodiment of the present disclosure is an Ethernet cable, but the present disclosure is not limited to this. Transmission line 1 may be a coaxial cable, a twisted pair cable, a flexible flat cable (FFC), a flexible printed circuit (FPC), or the like. Note that, when transmission line 1 is one of these transmission lines, the communication method related to transmission line 1 is not limited to Ethernet communication.

A technique is desired that can detect a disconnection in a transmission line with the simple process and configuration.

For example, a technique for detecting the characteristics of transmission line 1 by using time domain reflectometry (TDR) is known. When detecting a change in the characteristics of transmission line 1 using such a technique and detecting an abnormality related to transmission line 1 based on the detection result, it is necessary to output a rising pulse to transmission line 1 with high reproducibility in order to accurately detect a change in the characteristics of transmission line 1, and as a result, a high-performance pulse signal generator is required.

Further, when the characteristics such as the S parameter of transmission line 1 are measured by using the network analyzer and the abnormality related to transmission line 1 is detected based on the measurement result, it is necessary to use an expensive and complicated measurement device in order to obtain sufficient detection accuracy, and it is necessary to calibrate the measurement device every time the measurement is performed.

In contrast, in relay device 101 according to the embodiment of the present disclosure, signal output unit 12 outputs 1-bit digital signal Ds1 representing the waveform of the sinusoidal wave or a signal based on digital signal Ds1 to transmission line 1 as the measurement signal. Signal reception unit 13 receives a response signal including a signal reflecting the measurement signal from transmission line 1 and converts the response signal into 1-bit digital signal Ds2. Operation unit 14 performs a logical operation of digital signal Ds2 converted by signal reception unit 13 and 1-bit digital signal Ds3 based on the sinusoidal wave. Detection unit 15 detects the abnormality of transmission line 1, based on the operation result obtained by operation unit 14.

In this way, the abnormality of transmission line 1 can be detected by a simple process and configuration in which the logical operation is performed between digital signal Ds2 based on the response signal and digital signal Ds3 as the reference signal and the operation result is used for the abnormality detection. Further, for example, by the configuration in which 1-bit digital signal Ds1 or the signal based on digital signal Ds1 is output to transmission line 1, the interface between the digital circuit and the analog circuit can be simplified as compared with the configuration in which the analog signal is generated and output to transmission line 1. Therefore, relay device 101 according to the embodiment of the present disclosure can detect the abnormality of transmission line 1 with the simple process and configuration.

The above embodiments should be considered as illustrative and not restrictive in all respects. The scope of the present invention is defined by the appended claims rather than the foregoing description, and is intended to include all modifications within the scope and meaning equivalent to the appended claims.

Each process (each function) of the above-described embodiments is realized by a processing circuit (circuitry) including one or more processors. The processing circuit may be configured by an integrated circuit or the like in which one or a plurality of memories, various analog circuits, and various digital circuits are combined in addition to the one or the plurality of processors. The one or more memories store programs (instructions) for causing the one or more processors to execute the processes. The one or more processors may execute the processes in accordance with the program read from the one or more memories, or may execute the processes in accordance with logic circuit designed in advance to execute the processes. The processor may be any of various processors suitable for control of a computer, such as a central processing unit (CPU), a graphics processing unit (GPU), a digital signal processor (DSP), a field programmable gate array (FPGA), and an application specific integrated circuit (ASIC). The plurality of processors physically separated from each other may execute the processes in cooperation with each other. For example, the processors mounted on a plurality of physically separated computers may execute the processes in cooperation with each other via a network such as a local area network (LAN), a wide area network (WAN), or the Internet. The program may be installed in the memory from an external server device or the like via the network, or may be distributed in a state of being stored in recording media such as a compact disc read only memory (CD-ROM), a digital versatile disk read only memory (DVD-ROM), and a semiconductor memory and installed in the memory from the recording media.

The above description includes the features appended below.

Appendix 1

A detection device including:

a signal output unit configured to output a 1-bit first digital signal representing a waveform of a predetermined pattern or a signal based on the first digital signal to a transmission line as a measurement signal;

a signal reception unit configured to receive a response signal including a signal reflecting the measurement signal from the transmission line and convert the response signal into a 1-bit second digital signal;

an operation unit configured to perform a logical operation of the second digital signal converted by the signal reception unit and a 1-bit third digital signal based on the predetermined pattern; and a detection unit configured to detect an abnormality of the transmission line, based on an operation result obtained by the operation unit, wherein the signal output unit includes:

a signal generation unit configured to generate a sinusoidal wave; and a modulation unit configured to generate the first digital signal by performing delta-sigma modulation on a waveform of the sinusoidal wave generated by the signal generation unit.

REFERENCE SIGNS LIST

1 transmission line
11 relay unit
12, 12A, 12B signal output unit
13 signal reception unit
14, 24 operation unit
15 detection unit
16 storage unit
17 communication port
21, 22 detection processing unit
101,102 relay device
111 communication device
121 signal generation unit
122 modulation unit
123 filtering circuit
124 signal acquisition unit
241 adjustment unit
242 XOR circuit
301 communication system
Ws sinusoidal wave
Ds1 digital signal
Ds2, Ds2*a*, Ds2*b* digital signal
X, Xa, Xb, Xc exclusive OR
IV, IVa, IVb, IVc integral
CT correspondence table

The invention claimed is:

1. A detection device comprising:

a signal output circuit configured to output a first digital signal consisting of one bit representing a waveform of a predetermined pattern or a signal based on the first digital signal to a transmission line as a measurement signal;

a signal reception circuit configured to receive a response signal including a signal reflecting the measurement signal from the transmission line and convert the response signal into a second digital signal consisting of one bit;

an operation circuit configured to perform a logical operation of the second digital signal converted by the signal reception circuit and a third digital signal consisting of one bit based on the predetermined pattern; and a detection circuit configured to detect an abnormality of the transmission line, based on an integral of an operation result obtained by the operation circuit, wherein the first digital signal is a signal obtained by performing pulse density modulation on the waveform of the predetermined pattern.

2. The detection device according to claim 1, wherein the operation circuit is configured to calculate an exclusive OR of the second digital signal and the third digital signal.

3. The detection device according to claim 2, wherein the signal output circuit includes a filtering circuit and is configured to output a signal obtained by subjecting the first digital signal to filtering processing by the filtering circuit to the transmission line as the measurement signal.

4. The detection device according to claim 2, wherein the first digital signal is a signal obtained by performing, as the pulse density modulation, delta-sigma modulation on the waveform of the predetermined pattern, and the signal reception circuit includes a delta-sigma modulator configured to convert the response signal into the second digital signal.

5. The detection device according to claim 2, wherein the operation circuit includes an adjustment circuit configured to perform phase adjustment of the second digital signal and the third digital signal.

6. The detection device according to claim 2, further comprising:

a storage circuit configured to store correspondence information indicating a correspondence relationship between the integral of the operation result and an abnormality position on the transmission line, wherein the detection circuit is configured to calculate the integral and, based on the integral and the correspondence information, determine the abnormality position on the transmission line.

7. The detection device according to claim 2, wherein the operation circuit is configured to perform the logical operation by using the first digital signal as the third digital signal.

8. The detection device according to claim 1, wherein the signal output circuit includes a filtering circuit and is configured to output a signal obtained by subjecting the first digital signal to filtering processing by the filtering circuit to the transmission line as the measurement signal.

9. The detection device according to claim 8, wherein the first digital signal is a signal obtained by performing, as the pulse density modulation, delta-sigma modulation on the waveform of the predetermined pattern, and the signal reception circuit includes a delta-sigma modulator configured to convert the response signal into the second digital signal.

10. The detection device according to claim 8, wherein the operation circuit includes an adjustment circuit configured to perform phase adjustment of the second digital signal and the third digital signal.

11. The detection device according to claim 8, further comprising:

a storage circuit configured to store correspondence information indicating a correspondence relationship between the integral of the operation result and an abnormality position on the transmission line, wherein the detection circuit is configured to calculate the integral and, based on the integral and the correspondence information, determine the abnormality position on the transmission line.

12. The detection device according to claim 8, wherein the operation circuit is configured to perform the logical operation by using the first digital signal as the third digital signal.

13. The detection device according to claim 1, wherein the pulse density modulation includes delta-sigma modulation, and the signal reception circuit includes a delta-sigma modulator configured to convert the response signal into the second digital signal.

14. The detection device according to claim 13, wherein the operation circuit includes an adjustment circuit configured to perform phase adjustment of the second digital signal and the third digital signal.

15. The detection device according to claim 13, further comprising:

a storage circuit configured to store correspondence information indicating a correspondence relationship between the integral of the operation result and an abnormality position on the transmission line, wherein the detection circuit is configured to calculate the integral and, based on the integral and the correspondence information, determine the abnormality position on the transmission line.

16. The detection device according to claim 1, wherein the operation circuit includes an adjustment circuit configured to perform phase adjustment of the second digital signal and the third digital signal.

17. The detection device according to claim 16, further comprising:

a storage circuit configured to store correspondence information indicating a correspondence relationship between the integral of the operation result and an abnormality position on the transmission line, wherein the detection circuit is configured to calculate the integral and, based on the integral and the correspondence information, determine the abnormality position on the transmission line.

18. The detection device according to claim 1, further comprising:

a storage circuit configured to store correspondence information indicating a correspondence relationship between the integral of the operation result and an abnormality position on the transmission line, wherein the detection circuit is configured to calculate the integral and, based on the integral and the correspondence information, determine the abnormality position on the transmission line.

19. The detection device according to claim 1, wherein the operation circuit is configured to perform the logical operation by using the first digital signal as the third digital signal.

20. A detection method for a detection device, comprising:

outputting a first digital signal consisting of one bit representing a waveform of a predetermined pattern or a signal based on the first digital signal to a transmission line as a measurement signal;

receiving a response signal including a signal reflecting the measurement signal from the transmission line and converting the response signal into a second digital signal consisting of one bit;

performing a logical operation of the converted second digital signal and a third digital signal consisting of one bit based on the predetermined pattern; and detecting an abnormality of the transmission line, based on an integral of an operation result, wherein the first digital signal is a signal obtained by performing pulse density modulation on the waveform of the predetermined pattern.

* * * * *